United States Patent
Collins et al.

(10) Patent No.: US 10,087,523 B2
(45) Date of Patent: Oct. 2, 2018

(54) VAPOR DELIVERY METHOD AND APPARATUS FOR SOLID AND LIQUID PRECURSORS

(71) Applicant: Lam Research Corporation, Fremont, CA (US)

(72) Inventors: Joshua Collins, Sunnyvale, CA (US); Eric H. Lenz, Livermore, CA (US); Michal Danek, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/595,788

(22) Filed: May 15, 2017

(65) Prior Publication Data

US 2017/0335450 A1    Nov. 23, 2017

Related U.S. Application Data

(60) Provisional application No. 62/339,696, filed on May 20, 2016.

(51) Int. Cl.

| | | |
|---|---|---|
| *C23C 16/448* | (2006.01) | |
| *C23C 16/455* | (2006.01) | |
| *C23C 16/52* | (2006.01) | |

(52) U.S. Cl.
CPC ........ *C23C 16/4481* (2013.01); *C23C 16/448* (2013.01); *C23C 16/45502* (2013.01); *C23C 16/45512* (2013.01); *C23C 16/45544* (2013.01); *C23C 16/45561* (2013.01); *C23C 16/45574* (2013.01); *C23C 16/52* (2013.01)

(58) Field of Classification Search
CPC .............................................. C23C 16/45561
See application file for complete search history.

(56) References Cited

U.S. PATENT DOCUMENTS

| | | | |
|---|---|---|---|
| 4,733,084 A | 3/1988 | Oosaka | |
| 5,173,749 A | 12/1992 | Tell et al. | |
| 6,787,463 B2 | 9/2004 | Mardian | |
| 9,951,423 B2 | 4/2018 | Lenz | |
| 2003/0072875 A1* | 4/2003 | Sandhu | C23C 16/4481 118/715 |
| 2005/0221004 A1* | 10/2005 | Kilpela | C23C 16/45525 118/715 |
| 2007/0292612 A1* | 12/2007 | Ueno | C23C 16/4482 427/248.1 |
| 2010/0154995 A1 | 6/2010 | Kudo et al. | |
| 2010/0178423 A1* | 7/2010 | Shimizu | C23C 16/45561 137/14 |
| 2014/0216339 A1* | 8/2014 | Nagase | C23C 16/4485 118/712 |

(Continued)

FOREIGN PATENT DOCUMENTS

JP    2015010281 A    1/2015

OTHER PUBLICATIONS

U.S. Office Action dated Apr. 30, 2018, in U.S. ppl. No. 15/169,582.

*Primary Examiner* — Binu Thomas
(74) *Attorney, Agent, or Firm* — Weaver Austin Villeneuve & Sampson LLP

(57) ABSTRACT

A vaporizer system is provided that allows for rapid shifts in the flow rate of a vaporized reactant while maintaining a constant overall flow rate of vaporized reactant and carrier gas.

23 Claims, 2 Drawing Sheets

(56) References Cited

U.S. PATENT DOCUMENTS

| | | | |
|---|---|---|---|
| 2015/0140694 A1* | 5/2015 | Inoue | C23C 16/45561 118/712 |
| 2015/0267297 A1* | 9/2015 | Shiba | C23C 16/45561 427/248.1 |
| 2016/0047047 A1* | 2/2016 | Moroi | C23C 16/4481 118/712 |
| 2016/0115594 A1* | 4/2016 | Moroi | C23C 16/45561 118/728 |
| 2017/0342562 A1 | 11/2017 | Lind et al. | |

* cited by examiner

VAPOR DELIVERY METHOD AND APPARATUS FOR SOLID AND LIQUID PRECURSORS

CROSS REFERENCE TO RELATED APPLICATIONS

This application claims benefit of priority under 35 U.S.C. § 119(e) to U.S. Provisional Patent Application No. 62/339,696, filed May 20, 2016, and titled "VAPOR DELIVERY METHOD AND APPARATUS FOR SOLID AND LIQUID PRECURSORS," which is hereby incorporated herein by reference in its entirety.

BACKGROUND

During semiconductor processing operations, one or more reactants (also referred to herein as "precursors") may be distributed across a semiconductor wafer in order to perform etching, deposition, cleaning, or other operations. In some such semiconductor operations, the reactant or reactants may be provided in a vaporized form that is suspended in a carrier gas, e.g., a gas that may be chemically inert with respect to the other reactants use, before being flowed across the semiconductor wafer.

Discussed herein are methods and apparatuses for providing such vaporized reactants.

BRIEF DESCRIPTION OF THE DRAWINGS

The accompanying drawings are illustrative and the concepts discussed herein are not limited to only the depicted implementations.

SUMMARY

Figure 1:
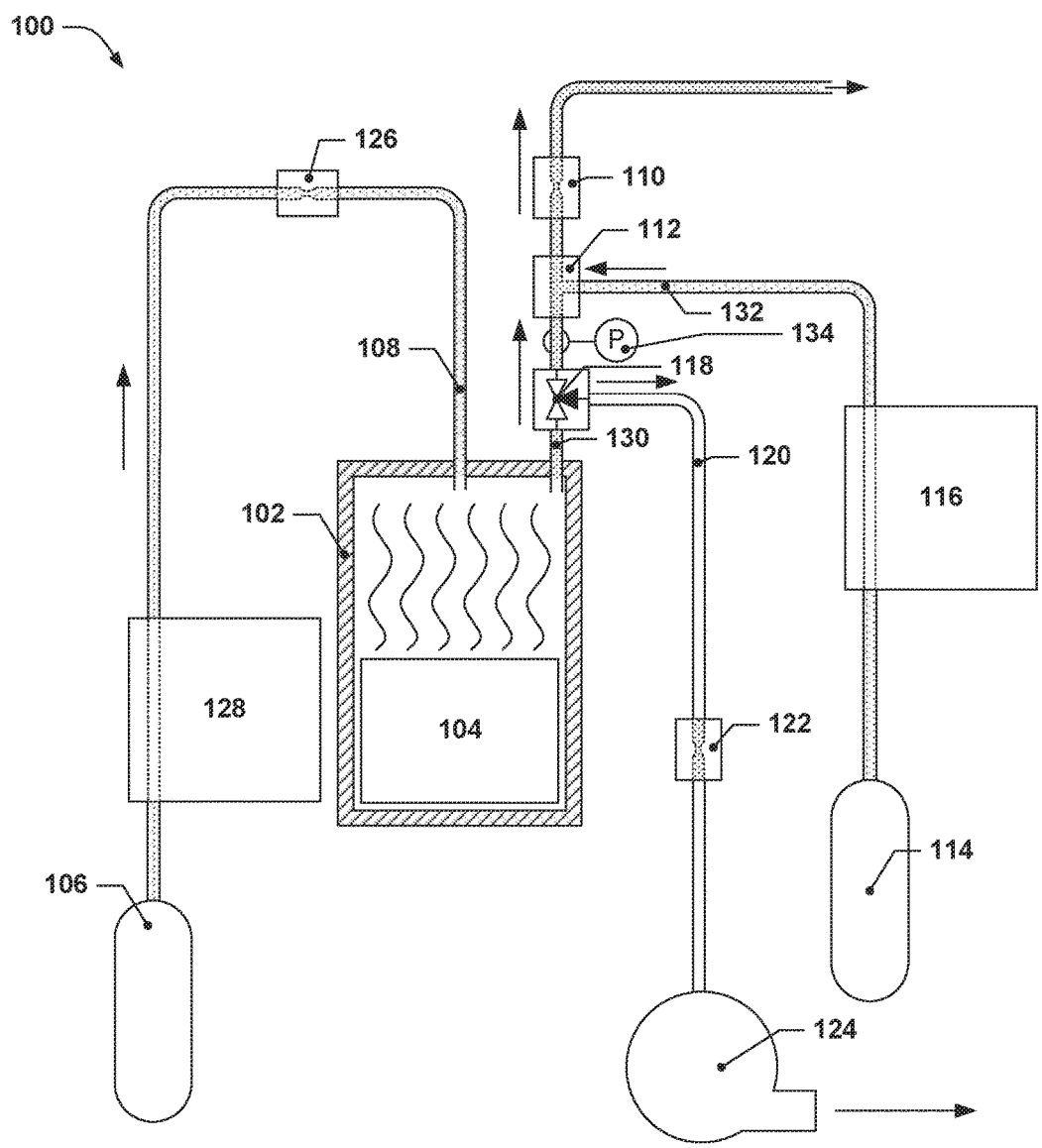
FIG. 1 depicts a high-level schematic of a solid reactant vaporizer.

Details of one or more implementations of the subject matter described in this specification are set forth in the accompanying drawings and the description below. Other features, aspects, and advantages will become apparent from the description, the drawings, and the claims.

In some implementations, an apparatus for supplying vapor to a component of a semiconductor processing tool is provided. The apparatus may include a first ampoule configured to receive a first quantity of reactant within a first interior volume of the first ampoule, a first carrier gas inlet that is in fluidic communication with the first interior volume, a first vapor outlet that is also in fluidic communication with the first interior volume, a first sonic flow restrictor, and a first dilution gas inlet that is in fluidic communication with the first vapor outlet. In such implementations, the first sonic flow restrictor may be positioned downstream of the first carrier gas inlet and the first ampoule and the first dilution gas inlet may be connected with the first vapor outlet in a location between the first ampoule and the first sonic flow restrictor.

In some such implementations, the first quantity of reactant may be in solid phase, whereas in other such implementations, the first quantity of reactant may be in liquid phase.

In some further implementations, the first sonic flow restrictor may be sized such that carrier gas and vapor that are flowed through the first sonic flow restrictor during normal operating conditions of the semiconductor processing tool experience choked flow.

In some further implementations, the apparatus may further include a first carrier gas flow controller configured to control the amount of carrier gas that flows through the first carrier gas inlet, a first dilution gas flow controller configured to control the amount of dilution gas that flows through the first dilution gas inlet, and a controller. The controller may include one or more processors and a memory. The one or more processors may be communicatively connected with the memory, the first carrier gas flow controller, and the first dilution gas flow controller, and the memory may store computer-executable instructions for controlling the one or more processors to cause the first carrier gas flow controller and the first dilution gas flow controller to maintain a constant combined flow rate.

In some further implementations, the apparatus may further include a pressure sensor located between the first ampoule and the first sonic flow restrictor, and the memory may further store instructions for controlling the one or more processors to control the first carrier gas flow controller and the first dilution gas flow controller to increase the ratio of carrier gas to dilution gas, while keeping the total flow combined flow rate of the carrier gas and the dilution gas constant, when the pressure sensor indicates a pressure of the combined carrier gas flow, dilution gas flow, and any vaporized reactant from the first quantity of reactant is below a first threshold, and control the first carrier gas flow controller and the first dilution gas flow controller to decrease the ratio of carrier gas to dilution gas, while keeping the total flow combined flow rate of the carrier gas and the dilution gas constant, when the pressure sensor indicates a pressure of the combined carrier gas flow, dilution gas flow, and any vaporized reactant from the first quantity of reactant is above a second threshold.

In some implementations, the apparatus may further include the first quantity of the reactant within the interior volume.

In some implementations, the reactant may be a solid-phase reactant selected from the group consisting of tungsten pentachloride and tungsten hexachloride.

In some implementations, the apparatus may further include a first carrier gas inlet mass flow controller that is positioned upstream of the first ampoule on the first carrier gas inlet.

In some implementations, the apparatus the apparatus may further include a pressure sensor located between the first ampoule and the first sonic flow restrictor, and a controller including a memory and one or more processors communicatively coupled with the pressure sensor, the first carrier gas inlet mass flow controller, and the memory, the memory storing instructions for controlling the one or more processors to receive pressure data from the pressure sensor and to adjust the flow of carrier gas to the first ampoule responsive to changes in the pressure data.

In some such implementations, the memory may further store instructions for controlling the one or more processors to: obtain, during a first time period, pressure measurements from the pressure sensor associated with a particular flow of carrier gas from the carrier gas inlet, dilution gas from the dilution gas inlet, or carrier gas from the carrier gas inlet and dilution gas from the dilution gas inlet when the first ampoule does not contain any reactant or when whatever reactant is in the first ampoule is not evaporating or supplying vapor; obtain, during a second time period, pressure measurements from the pressure sensor associated with the same particular flow of carrier gas from the carrier gas inlet, dilution gas from the dilution gas inlet, or carrier gas from the carrier gas inlet and dilution gas from the dilution gas inlet when the first ampoule contains the first quantity of reactant; and determine an amount of vaporized reactant flowing through the first sonic flow restrictor during the second time period based, at least in part, on the difference in the pressure measurements obtained during the first time period and the pressure measurements obtained during the second time period.

In some implementations of the apparatus, the apparatus may further include a temperature control system for controlling the temperature in the first ampoule, and the memory further stores instructions for controlling the one or more processors to control the temperature control system to increase the temperature in the first ampoule when the difference in the pressure measurements drops below a first target amount and control the temperature control system to decrease the temperature in the first ampoule when the difference in the pressure measurements increases above a second target amount.

In some implementations, the apparatus may further include a carrier gas source that is connected with the first carrier gas inlet and configured to supply a carrier gas to the first ampoule.

In some implementations, the apparatus may further include a dilution gas source that is connected with the first dilution gas inlet and configured to supply a dilution gas to the first ampoule. In some such implementations, the dilution gas and the carrier gas may be the same gas. In some further such implementations, the dilution gas source and the carrier gas source may be the same gas source.

In some implementations, the apparatus may further include a first vacuum outlet that may join the first vapor outlet downstream of the first ampoule and upstream of the first sonic flow restrictor.

In some implementations, the apparatus may also include a second ampoule configured to receive a second quantity of reactant within a second interior volume of the second ampoule, a second carrier gas inlet that is in fluidic communication with the second interior volume, a second vapor outlet that is also in fluidic communication with the second interior volume, a second sonic flow restrictor, and a second dilution gas inlet that is in fluidic communication with the second vapor outlet. In such implementations, the second sonic flow restrictor may be positioned downstream of the second carrier gas inlet and the second ampoule and the second dilution gas inlet may be connected with the second vapor outlet in a location between the second ampoule and the second sonic flow restrictor.

In some further such implementations, the first vapor outlet and the second vapor outlet may join into a common vapor outlet downstream of the first sonic flow restrictor and the second sonic flow restrictor, respectively.

In some additional or alternative such implementations, the first carrier gas inlet and the second carrier gas inlet may diverge from a common carrier gas inlet upstream of the first ampoule and the second ampoule.

In some implementations, the first dilution gas inlet and the second dilution gas inlet may diverge from a common dilution gas inlet upstream of the first vapor outlet and the second vapor outlet. In some further such implementations, the apparatus may further include a dilution gas mass flow controller located on the common dilution gas inlet.

In some implementations, the apparatus may include a vapor accumulator reservoir and a plurality of semiconductor processing stations. In such implementations, each semiconductor processing station may include a microvolume, the vapor accumulator reservoir may have a vapor accumulation volume that is at least as large as the number of semiconductor processing stations times the microvolume volume, the vapor accumulator reservoir may be configured to supply vapor from the first vapor outlet to each semiconductor processing station, the first vapor outlet may empty into the vapor accumulator reservoir downstream of the first sonic flow restrictor, and the vapor accumulator reservoir may be downstream of the first sonic flow restrictor.

Description

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

There are many concepts and implementations described and illustrated herein. While certain features, attributes and advantages of the implementations discussed herein have been described and illustrated, it should be understood that many others, as well as different and/or similar implementations, features, attributes and advantages of the present disclosure, are apparent from the description and illustrations. As such, the below implementations are merely exemplary. They are not intended to be exhaustive or to limit the disclosure to the precise forms, techniques, materials and/or configurations disclosed. Many modifications and variations are possible in light of this disclosure. It is to be understood that other implementations may be utilized and operational changes may be made without departing from the scope of the present disclosure. As such, the scope of the disclosure is not limited solely to the description below because the description of the below implementations has been presented for the purposes of illustration and description.

The present disclosure is neither limited to any single aspect nor implementation, nor to any single combination and/or permutation of such aspects and/or implementations. Moreover, each of the aspects of the present disclosure, and/or implementations thereof, may be employed alone or in combination with one or more of the other aspects and/or implementations thereof. For the sake of brevity, many of those permutations and combinations will not be discussed and/or illustrated separately herein.

The present disclosure is directed at vaporizer systems and techniques, and may use the terms "downstream" and "upstream" to refer to the relative positioning of components with respect to the direction of gas flow associated with such components during normal operation of the system. For example, when gas is flowed through two components during normal operations, the "upstream" component will receive that gas prior to the "downstream" component, and vice-versa.

Disclosed herein are methods and apparatuses for producing a vaporized precursor or reactant for delivery to one or more semiconductor processing chambers. The concepts disclosed herein may be particularly applicable in cyclic, multi-phase semiconductor processing operations, such as ALD or ALE processes, and may also be well-suited for use in multi-station semiconductor processing tools, i.e., tools where multiple semiconductor wafers may be processed simultaneously in the same chamber or in separate chambers sharing one or more tool subsystems, e.g., a controller, gas distribution system, vacuum pumping system, etc. The concepts disclosed herein may also be implemented in scenarios where there are no cyclic, multi-phase semiconductor processing operations involved and/or in single-station semiconductor processing tools, if desired.

As part of their work in developing a new semiconductor processing tool, the present inventors developed a new type of vaporizer system. In such a vaporizer system, a solid reactant or precursor may be placed into a chamber or vessel, referred to herein as an "ampoule." The ampoule may be made of any suitable material that is chemically compatible with the vaporized reactant, e.g., a stainless steel ampoule may be used with tungsten pentachloride or tungsten hexachloride. The ampoule may be heated to a desired temperature and a carrier gas may be flowed through the ampoule at that temperature in order to maintain a desired vapor flow rate from the vaporizer. The vaporized reactant may thus become entrained in the carrier gas flow and be flowed out of the ampoule. In addition to the ampoule, the present inventors also determined that adding two components—a sonic flow restrictor and a dilution gas inlet—downstream of the ampoule, but prior to delivering the vapor/carrier gas mixture from the vaporizer system, was beneficial. The dilution gas inlet is positioned upstream of the sonic flow restrictor.

It is to be understood that while the vaporizer concepts described herein are discussed with respect to a solid reactant or precursor, the same vaporizer concepts may be implemented for use with liquid-phase reactants or precursors as well. In such implementations, the carrier gas may be introduced from one or more ports of the ampoule that are submerged in the liquid-phase reactant or precursor such that the carrier gas bubbles up through the liquid reactant or precursor. This provides greater surface area contact between the carrier gas and the reactant, which increases the evaporation rate of the liquid-phase reactant or precursor. In solid reactant vaporizer systems, the solid reactant may be provided in the form of multiple small pieces that are supported on trays or racks within the ampoule to increase the amount of surface area that is in contact with the carrier gas; the carrier gas may be flowed past trays/racks and the solid reactants located on such trays/racks. It is also to be understood that, for simplicity and readability, the terms "vaporization" or "evaporation" are used herein to refer to the transition from a liquid state to a gaseous state as well as to the transition from a solid state to a gaseous state, which may technically be referred to as "sublimation." For example, reference to the "vapor pressure" of a substance is to be understood to be equivalent to the "sublimation pressure" of that substance if the substance is in solid phase.

The sonic flow restrictor may be sized such that, at all flow rates that are anticipated for the vaporizer system during normal operational use, i.e., flow rates occurring during semiconductor processing operations in which the vapor is to be used, the flow through the sonic flow restrictor is choked flow, i.e., a sonic flow. In some implementations, the sonic flow restrictor may actually be sized larger than as described above, i.e., such that at all flow rates that are anticipated for the vaporizer system during normal operational use, the flow through the sonic flow restrictor may not be choked flow, but may be a flow having a Mach number as low as 0.7, which may still provide adequate isolation from downstream pressure fluctuations in some circumstance. This isolates the vaporizer system from potential pressure fluctuations downstream of the sonic flow restrictor. For example, in a semiconductor processing tool in which vapor/carrier gas flows are intermittently provided, there may be time-varying pressure increases and decreases based on whether the vapor/carrier gas are being provided to a semiconductor processing chamber (resulting in a drop in pressure downstream of the sonic flow restrictor) or are not being provided to any semiconductor processing chamber (resulting in an increase in the pressure downstream of the sonic flow restrictor). By placing a sonic flow restrictor downstream of the ampoule, pressure fluctuations that may arise downstream of the sonic flow restrictor may be prevented from affecting the pressure environment in the ampoule. The dilution gas inlet may be used to add additional carrier gas to the carrier gas/vapor flow that comes from the ampoule, thereby providing a mechanism whereby the total flow through the sonic flow restrictor and the ampoule pressure may both be kept constant, thus ensuring a constant flow rate of vaporized precursor from the vaporizer system. The dilution gas source and the carrier gas source supply the same type of gas, and may, in some implementations, actually be provided by the same, common gas source, e.g., a facility gas source. The carrier and dilution gases may, for example, be any suitable, chemically inert gas, such as argon, nitrogen, neon, or helium.

FIG. 1 depicts an example of a vaporizer system according to the concepts discussed herein. The vaporizer system 100 may include an ampoule 102 that has an internal volume that contains a solid-phase reactant 104, such as tungsten hexachloride, tungsten pentachloride, or any of a variety of other solid reactants. The ampoule 102 may be heated to a desired temperature, e.g., 150° C., using, for example, heating jackets or other heat sources (not shown). A carrier gas, e.g., a gas that is chemically inert with respect to at least the reactant, from a carrier gas source 106 may be flowed through a carrier gas inlet 108. The carrier gas source 106 may, for example, be a facility gas source that supplies such carrier gas to multiple vaporizers, as well as to multiple other pieces of semiconductor processing equipment. The flow of carrier gas through the carrier gas inlet 108 may be regulated, for example, by a mass flow controller (MFC) 128 or other suitable flow control device.

An optional carrier gas inlet flow restrictor 126, which may be sized such that choked or sonic flow exists at the carrier gas inlet flow restrictor during all carrier gas flow conditions normally experienced during normal semiconductor processing operations conducted using the vaporizer system 100, may be placed between the MFC 128 and the ampoule 102. The choked flow at the carrier gas inlet flow restrictor 126 may be used to prevent vaporized reactant from the ampoule 102 from travelling into the MFC 128 or the carrier gas source 106, where it may damage such components. The vaporized reactant and the carrier gas with which it is mixed may condense if the temperature of the gas/vapor mixture drops below the condensation temperature for the vapor under the local pressure conditions within vaporizer; moreover, the pressure of the vaporized reactant/carrier gas mixture may decrease downstream of the vaporizer, which may cause the condensation temperature of the mixture to be reduced as well. The carrier gas inlet 108 may therefore be heated to prevent the condensation of any vaporized reactant that migrates upstream of the ampoule 102. The carrier gas inlet flow restrictor 126 may serve as a reactant migration barrier, effectively preventing any backflow of the vaporized reactant past the carrier gas inlet flow restrictor 126. This may allow the carrier gas inlet 108 to be kept unheated upstream of the carrier gas inlet flow restrictor 126, as there is no danger of reactant condensation in these regions.

The carrier gas that is introduced into the ampoule 102 may receive vaporized reactant from the solid reactant 104. The flow rate and pressure of the carrier gas from the carrier gas source 106 may be maintained such that a pressure conducive to vaporization of the solid reactant 104 (at the ampoule temperature) exists in the ampoule, i.e., such that the partial pressure of the vaporized reactant is kept at the vapor pressure of the reactant at the local temperature conditions that exist in the ampoule 102. For example, if the target gas molar mixture ratio of 98.5% carrier gas/1.5% vaporized reactant and the vaporized reactant has a vapor pressure of approximately 1 Torr, then the total pressure of the carrier gas/vaporized reactant mixture in the ampoule may be kept at approximately 66 Torr in order to maintain the partial pressure of the vaporized reactant at the vapor pressure The carrier gas/vapor mixture may then exit the ampoule 102 via the vapor outlet 130, which may be connected with a sonic flow restrictor 110 which is downstream of the ampoule 102. A T-junction 112 or other inlet may allow additional carrier gas to be introduced into the carrier gas/vapor flow from a dilution carrier gas source 114, thereby further diluting the vaporized reactant.

As discussed earlier, the sonic flow restrictor 110 may serve as a barometric isolator, i.e., it may be sized to maintain choked or sonic flow during all normal operating conditions of the vaporizer system 100 such that pressure fluctuations downstream of the sonic flow restrictor 110 do not affect the pressure upstream of the sonic flow restrictor 110. For example, for a vaporizer that sees a total carrier gas flow rate of approximately 200 standard cubic centimeters per minute (sccm) at a temperature of approximately 165° C., such a sonic flow restrictor 110 may have a minimum orifice with a diameter of approximately 0.03 inches, e.g., 0.033 inches, in diameter. Under such conditions, the ampoule pressure would normally be proportional to the total flow of carrier gas and vapor through the sonic flow restrictor 110. However, as the ampoule pressure rises, the vaporization rate of the solid reactant decreases—the result is that the net flow rate of the vapor remains relatively constant regardless of carrier gas flow rate, making adjustment of the vapor flow rate very difficult.

The present inventors recognized that by including a dilution gas introduction point or inlet, such as the T-junction 112, that may allow additional carrier gas to be introduced in the vapor flow path downstream of the ampoule 102 and upstream of the sonic flow restrictor 110, the flow rate of the vapor could easily and rapidly be adjusted through a large range of vapor flow rates. By providing the dilution gas introduction point downstream of the ampoule, the vaporizer system 100 allows the total flow of carrier gas to be divided between two flows—one that passes through the ampoule 102, and one that bypasses the ampoule 102. The flow rates of both carrier gases may be regulated, e.g., using the carrier gas MFC 128 and a dilution gas MFC 116, so as to ensure that the two carrier gas flows, in aggregate, maintain a constant combined carrier gas flow rate. As will be seen, this allows the vapor delivery rate to rapidly be set to any desired value in a range of operable vapor delivery rates while maintaining a constant pressure and temperature in the ampoule 102, thereby ensuring a stable vaporization rate.

In some implementations, a pressure sensor 134 may be configured to monitor the pressure within the line between the sonic flow restrictor 110 and the ampoule 102. The carrier gas from carrier gas source 106 and the dilution gas from dilution gas source 114 may be flowed through the sonic flow restrictor 110 at different specific total flows(as set by the MFCs 128 and 116, for example) and pressure measurements may be taken for each specific flow condition as part of a calibration exercise. During subsequent operation with an actual precursor in the ampoule 102 (during calibration, the precursor would be absent), the pressure at pressure sensor 134 may be monitored and any pressure increase that is caused by the addition of evaporated precursor for a given flow condition may be established by referencing the current pressure and comparing it against the calibrated pressure for that same carrier and dilution gas flow condition. The amount of pressure increase over the calibration pressure is directly proportional to the amount of evaporated precursor that is in the carrier/dilution gas flow. Thus, the pressure from the pressure sensor 134 may be used to monitor the amount of precursor that is flowed through the sonic flow restrictor 110. A controller, such as is described further below, may be configured to monitor output of the pressure sensor and to facilitate such calibration processes and in-situ pressure monitoring of the carrier/dilution/precursor gas flow during normal use.

In some implementations, the controller may also be communicatively connected with a temperature sensor that is configured to monitor the ampoule temperature and the controller may also cause the flow from the dilution gas source 114 and the carrier gas source 106 to be varied, while maintaining the same total combined gas flow through the sonic flow restrictor 110, to compensate for changes in ampoule temperature or precursor evaporation rate (as noted below, the precursor evaporation rate may change even if pressure/temperature conditions remain constant). In some such implementations, the temperature of the ampoule may not be monitored and the changes in precursor flow due to changes in temperature may be compensated for by altering the carrier gas/dilution gas flow ratio to maintain a constant precursor flow rate (thus allowing for temperature compensation without directly measuring ampoule temperature). In some implementations, the controller may also be configured to cause the ampoule temperature to change, e.g., by controlling a heater or other temperature control system configured to adjust the temperature of the ampoule 102, to control the pressure such that the precursor concentration stays constant. For example, if the amount of precursor present in the gas flowed through the sonic flow restrictor 110 starts to increase beyond the desired target amount or flow rate, the temperature of the ampoule 102 may be lowered to adjust the evaporation rate downwards and maintain the desired precursor flow rate. Conversely, if the amount of precursor present in the gas flowed through the sonic flow restrictor 110 starts to decrease below the desired target amount or flow rate, then the temperature of the ampoule 102 may be raised to adjust the evaporation rate upwards and maintain the desired precursor flow rate. Generally speaking, adjusting the mass flow rate of the carrier gas and the dilution gas may be done very quickly compared to changing the temperature of the ampoule, so controlling the pressure in order to change the amount of precursor flow rate may be preferable in some circumstances.

Such pressure adjustment control can be useful as the precursor in the ampoule 102 gets used up and, for example, the exposed surface area of the solid precursor shrinks as the solid precursor evaporates. As the exposed surface area of the solid precursor shrinks, so too does the amount of precursor that evaporates (assuming that pressure and temperature are kept constant). Thus, the controller may cause the temperature or the carrier gas flow rate to change in order to compensate for the changing solid precursor surface area in order to maintain the same precursor concentration through the sonic flow restrictor 110. For example, if the amount of precursor at the sonic flow restrictor 110 is lower than desired for a given flow rate through the sonic flow restrictor 110, then the amount of carrier gas flow may be increased in order to increase the amount of precursor in the gas flow while simultaneously reducing the amount of dilution gas flow by an amount corresponding to the increased carrier gas flow. If the amount of precursor at the sonic flow restrictor 110 is higher than desired for a given flow rate through the sonic flow restrictor, then the amount of carrier gas flow may be decreased in order to decrease the amount of precursor in the gas flow (with a corresponding increase in the dilution gas flow in order to maintain the same total amount of carrier gas+dilution gas flow through the sonic flow restrictor 110). If the pressure measured by the pressure sensor 134 matches the calibration pressure for the combined flow rates of the carrier gas and dilution gas plus an additional amount of pressure that matches the pressure increase that would be expected if a desired amount or flow of precursor gas was mixed in with the known amount of carrier/dilution gas, then the controller may determine that the correct amount of precursor gas flow is occurring.

The vapor delivery or flow rate may be determined according to the equation:

$$flow_{vapor} = \frac{p_{vapor}}{p_{ampoule}} \cdot (flow_{vapor} + flow_{carrier}) = \left(\frac{\frac{p_{vapor}}{p_{ampoule}}}{1 - \frac{p_{vapor}}{p_{ampoule}}}\right) \cdot flow_{carrier}$$

where $flow_{vapor}$=the flow rate of the vaporized reactant out of the vapor outlet, $p_{vapor}$=vapor pressure of the solid reactant (at a given ampoule temperature), $p_{ampoule}$=pressure in ampoule, $flow_{carrier}$=flow rate of carrier through the ampoule. Thus, the vapor flow rate is directly proportional to the flow rate of the carrier gas if ampoule pressure and temperature are kept constant. By splitting the total carrier gas flow through the sonic flow restrictor 110 between the ampoule 102 and the dilution gas inlet/T-junction 112, the amount of carrier gas flowing through the ampoule may be adjusted to any value between zero and the maximum total carrier gas flow through the sonic flow restrictor 110. The dilution gas flow may make up the remainder of the maximum total carrier gas flow, i.e., range from any value between the maximum total carrier gas flow (when the ampoule receives no carrier gas flow) and zero (when the ampoule receives maximum allowable carrier gas flow). Since the total amount of carrier gas and vapor flowing through the sonic flow restrictor may thus be kept constant, the pressure in the ampoule may be maintained at a constant level as well, thus making the flow of vapor directly dependent on the ratios of carrier gas flowed through the ampoule 102 and the T-junction 112. Such carrier gas and dilution gas flow ratios may be controlled through the use of mass flow controllers, such as the dilution gas MFC 116 and the carrier gas MFC 128, or other suitable gas flow controllers for each gas flow. The gas flow controllers may be controlled, for example, by a controller having one or more processors and a memory; the memory may store computer-executable instructions for controlling the gas flow controllers such that the total combined flow of carrier gas and dilution gas through the carrier gas inlet and the dilution gas inlet, respectively, remains constant during vapor delivery.

An additional subsystem that may optionally be added to the vaporizer system 101 is an exhaust system that includes a vacuum pump 124 (or suitable vacuum source) that is connected to the vapor outlet 130 by an exhaust line 120 (also referred to herein as vacuum outlet). The exhaust line 120 may connect with the vapor outlet 130 by way of a 3-way valve 118, which may be opened to allow the vapor/carrier gas mixture in the vapor outlet 130 to be drawn into the exhaust line 120. The exhaust system may be used to remove unwanted vapor from the ampoule, or to purge out other undesirable gases. In some implementations, the exhaust system may be used as a divert or shunt system to allow the vaporizer to continue operating at steady state without providing vaporized reactant or carrier gas to a process chamber through the sonic flow restrictor 110; such a vapor/carrier gas mixture would instead be diverted to the exhaust line 120 through the 3-way valve 118 and evacuated from the system. The exhaust line 120 may optionally include an exhaust sonic flow restrictor that acts to match the flow restriction provided by the sonic flow restrictor 110. This allows the flow impedance through the vapor outlet 130/sonic flow restrictor 110 and the exhaust line 120/exhaust sonic flow restrictor 122 to be kept the same, thereby reducing settling time when switching between the two flow paths.

The vaporizer system discussed above may be implemented in a ganged configuration that includes multiple vaporizer systems that are all arranged in parallel. The carrier gas inlet lines for each vaporizer system may be separately provided with carrier gas, or may be commonly supplied from a common trunk line or common carrier gas inlet. The carrier gas inlet for each vaporizer system may be separately controlled by a carrier gas MFC (with optional carrier gas inlet flow restrictor, such as carrier gas inlet flow restrictor 126) or by a single, common MFC. In the latter case of a single MFC that controls carrier gas flow to multiple ampoules, the carrier gas lines leading to the carrier gas inlet (or the carrier gas inlets themselves) may each be equipped with an identical flow restriction or other orifice to ensure even distribution of the metered carrier gas flow from the MFC to each of the ampoules. Correspondingly, the dilution gas for each vaporizer system may be provided by a common dilution gas source or by separate dilution gas sources, as controlled by dilution gas MFCs located on each dilution gas line travelling to a vaporizer system or, in some implementations, by one dilution MFC positioned upstream of all of the vaporizer systems, e.g., on a common dilution gas inlet that later branches into each discrete dilution gas inlet. Similarly, the vapor outlets of such vaporizer systems may also be joined together downstream of their respective sonic flow restrictors, e.g., into a common vapor outlet, before delivering the vaporized reactant to the ultimate destination, e.g., before delivery to a process chamber or a vapor accumulator or manifold that may distribute vapor to multiple process chambers or stations. Such a ganged configuration may not only, for example, multiply the potential range of vapor flow rates that may be achieved compared with only one such vaporizer, but may also allow for one or more vaporizer systems to be held in reserve. The reserve vaporizer systems may be brought on-line when an active vaporizer system must be taken offline, e.g., for repair or precursor/reactant refilling, thereby allowing for such maintenance to be performed without impacting the ability of the vaporizer systems to provide vapor for processing that is being performed on the semiconductor processing tool. This avoids potential downtime on the semiconductor processing tool.

The above-described vaporizer system may be used in a variety of different semiconductor processing tools, including, for example, atomic layer deposition tools. In atomic layer deposition, short, e.g., on the order of 1 second or less in duration, pulses of reactants are delivered in rapid succession to a semiconductor wafer. Such pulsing would normally cause upstream pressure perturbations in a vaporizer used to supply such reactants—the sonic flow restrictor in the system described above, however may prevent such perturbations from reaching the vaporizer system. Such tools may also incorporate multiple processing stations which may, at various times, have differing numbers of wafers loaded therein, thereby requiring a different total amounts of vaporized reactant at different times (if 4 wafers are loaded instead of 2 wafers, then twice as much vaporized reactant flow will be needed). The above-described vaporizer systems, which may rapidly be caused to change the total amount of vapor delivered, may be ideally suited to such scenarios since they allow the vapor delivery rate to be easily and quickly changed merely by changing the ratio of carrier gas flow to dilution gas flow—no temperature or pressure changes (both of which are time consuming) in the vaporizer system are required in order to achieve such vapor flow changes.

Figure 2:
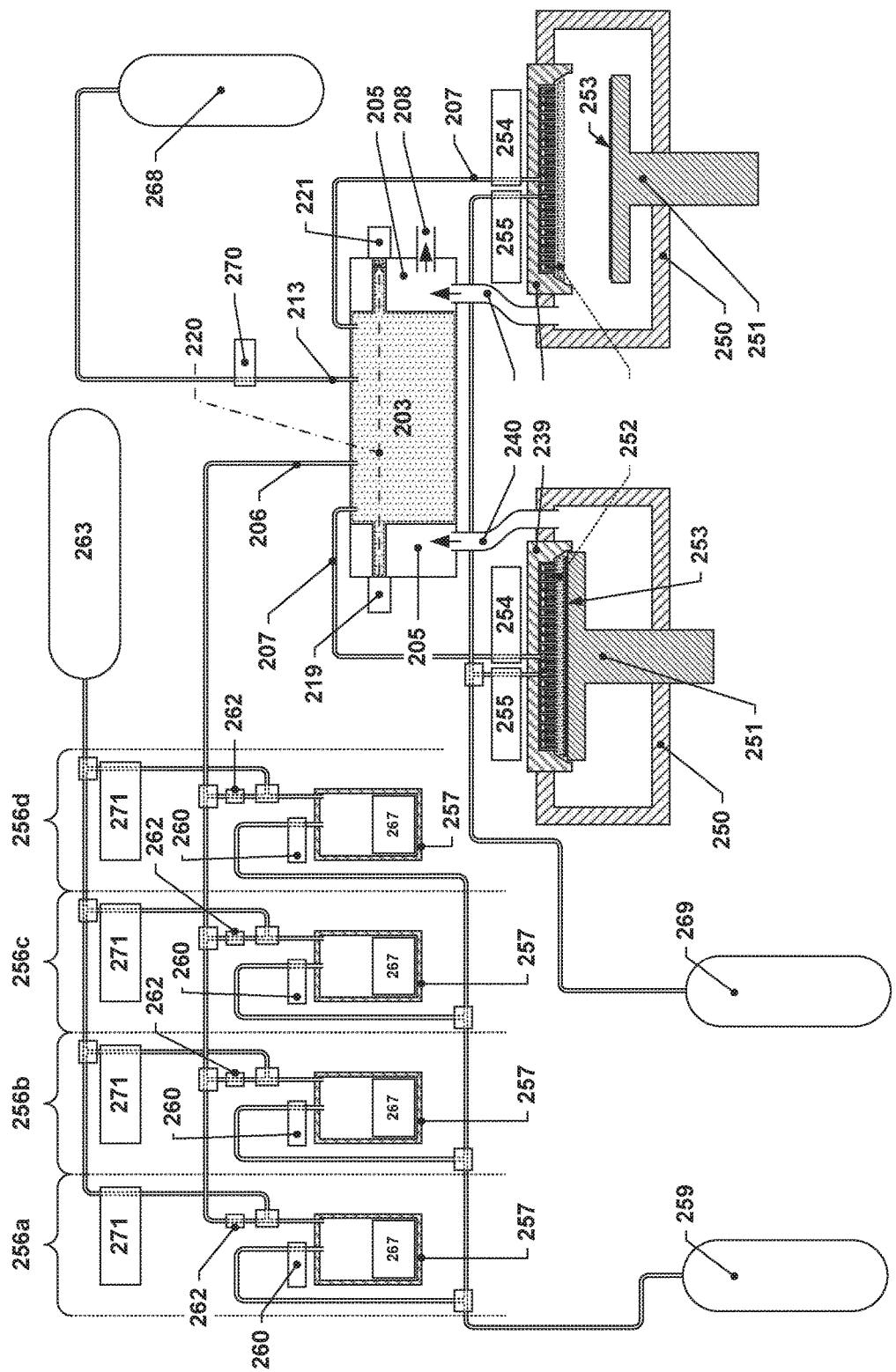
FIG. 2 depicts a high-level schematic of a semiconductor processing tool that incorporates a vapor accumulator reservoir.

FIG. 2 depicts a high-level schematic of a semiconductor processing tool that incorporates a ganged collection of vaporizer systems as described above. The semiconductor processing tool of FIG. 2 is a multi-station ALD-type tool. In FIG. 2, two semiconductor processing chambers (also potentially referred to herein as "reactors," "reaction chambers," or "process chambers") 250 are shown—each process chamber 250, which may represent a different processing station, may include a pedestal 251 that supports a semiconductor wafer 253 during semiconductor processing operations. The pedestal 251 may be movable between multiple vertical elevations in order to facilitate loading/unloading or processing of the semiconductor wafer 253; the pedestal 251 in the rightmost process chamber 250 is in a lowered position, whereas the pedestal 251 in the leftmost process chamber 250 is in a raised position.

Each process chamber 250 may include a chamber lid 239 that may include a plurality of gas distribution passages that distribute process gases across the semiconductor wafer 253. In this example, each chamber lid 239 includes two sets of separate gas distribution passages, each one for distributing a different precursor gas. This prevents one precursor from mixing with the residue of the other precursor, as would occur if both precursors were to be flowed through the same passages—such mixing may result in chemical reactions occurring in locations other than on the semiconductor wafer 253, which may be undesirable. In some implementations, the gas distribution passages may be in a structure that is separate from the chamber lid 239; it is to be understood that the concepts described herein may be utilized with either type of chamber lid 239 or gas distributor.

In systems such as ALD or ALE processing tools, a "microvolume" 252 may be formed within the process chamber during semiconductor processing operations. The microvolume 252 is formed between the pedestal 251 and the chamber lid 239/gas distributor when the pedestal 251 is in the position required for wafer processing; the chamber lid 239 or gas distributor may also have an annular wall that extends downward around the outer circumference of the pedestal 251, thereby defining a circumferential boundary to the microvolume. The microvolume is much smaller in volume than the overall volume of the process chamber 250, thereby allowing a smaller amount of precursor to be used—this allows for quicker dose delivery, quicker purges, less reactant waste, and various other benefits. The microvolume 252 may be thought of as the contiguous volume in between the surface through which gas is distributed across the semiconductor wafer 253 and the pedestal 251, and may terminate at the first major flow restriction beyond where the semiconductor wafer 253 is supported (where the first major flow restriction refers to a flow restriction large enough to prevent backflow of process gases into the microvolume during normal semiconductor processing operations).

Process gases may be evacuated from the process chambers 250 by way of vacuum forelines 240. The vacuum forelines 240 may be in fluidic communication with a vacuum pumping plenum volume 205 via separate vacuum inlet ports. In the depicted implementation, the vacuum pumping plenum volume 205 encircles a vapor accumulation volume 203.

The chamber lids 239 may each be supplied a first process gas containing a vapor from the vapor accumulation volume 203. The first process gas may be supplied to each process chamber 250 from the vapor accumulation volume 203 by way of a corresponding vapor outlet 207. The flow of the first process gas through each vapor outlet 207 may be controlled by a corresponding first process gas dose valve 254 (or control valve assembly), which may also include a flow restrictor, as discussed earlier, such that fluid flow through the that vapor outlet 207 is restricted to fully choked or sonic flow across the restrictor. Alternatively, the flow restrictor may be located elsewhere on the vapor outlet 207.

The vapor accumulation volume may have a volume that is sufficiently large enough to allow each process chamber to be supplied with a single dose of vapor without affecting the ability of the vapor accumulator reservoir to provide single doses to the other process chambers. For example, the vapor accumulation volume may be at least larger than the total volume of all of the microvolumes of the processing stations.

The chamber lids may also each be supplied a second process gas, such as hydrogen, from a second process gas source 269, as well as other gases, such as a chemically inert purge gas (not shown, although may be delivered using a system similar to that used for the second process gas). The flow of the second process gas into each chamber lid 239 may be controlled by a corresponding second process gas dose valve 255.

As can be seen, the vapor accumulation volume 203 may have an optical beam 220 that is emitted by a beam emitter 219. The optical beam 220 may transit the vapor accumulation volume 203 and be received by a photosensor 221, thereby forming a vapor concentration sensor, which may measure the amount of attenuation in the optical beam 220 due to the vapor concentration in the vapor accumulation volume 203 and thereby allow determination of the vapor concentration in the vapor accumulation volume 203.

The vapor accumulation volume may, in some implementations and as discussed earlier, be in fluidic communication with a dilution gas inlet 213 that is connected with a reservoir dilution gas source 268 (this is dilution gas system is in addition to the dilution gas that is provided between the ampoules and sonic flow restrictors of the vaporizer systems described above). Flow of dilution gas through the dilution gas inlet 213 may be controlled, for example, by a reservoir dilution gas valve 270 or other suitable control device. The dilution gas may be added, if desired, to reduce the vapor concentration in the vapor accumulation volume 203, depending on the requirements of the particular semiconductor processing being performed and the vapor concentration readings obtained using the vapor concentration sensor.

The vapor accumulation volume 203 may be continuously replenished with vapor supplied from one or more vaporizers 256, such as vaporizers 256a/b/c/d. The vaporizers 256a/b/c/d, which may each be a vaporizer system such as is described above, may each include an ampoule 257 that may contain a solid reactant 267; carrier gas from a carrier gas source 259 may be selectively provided to each ampoule 257 by way of a corresponding carrier gas flow controller 260, which may control whether carrier gas is supplied to the corresponding ampoule 257 and at what flow rate, if so. As the carrier gas is flowed through one of the ampoules, which may be maintained at a specified pressure and temperature, the reactant 267 may evaporate into the carrier gas and be carried out of the ampoule towards a flow restrictor 262. Prior to reaching the flow restrictor 262, the reactant vapor and carrier gas mixture may be augmented by additional carrier gas supplied from an ampoule dilution gas source 263; the additional carrier gas flow for each ampoule 257 may be regulated by a corresponding ampoule dilution gas flow controller 271. This combined flow of carrier gas and vapor may then pass through the flow restrictor 262, which may be sized to induce sonic flow in the carrier gas/vapor flow during normal operating conditions involved with semiconductor processing operations. As discussed above, the flow of carrier gas and dilution gas may be controlled such that the combined total flow of such gases through the flow restrictor 262 remains constant. Such sonic flow may serve as a buffer that prevents pressure fluctuations in the vapor accumulator reservoir from affecting the pressure environment in the ampoules 257.

Unless the context of this disclosure clearly requires otherwise, throughout the description and the embodiments, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein. Unless otherwise specified, the term "substantially" refers to within +/−5% of the value indicated.

What is claimed is:

1. An apparatus for supplying vapor to a component of a semiconductor processing tool, the apparatus comprising:
   a first ampoule configured to receive a first quantity of reactant within a first interior volume of the first ampoule;
   a first carrier gas inlet that is in fluidic communication with the first interior volume;
   a first vapor outlet that is also in fluidic communication with the first interior volume;
   a first sonic flow restrictor;
   a pressure sensor configured to measure pressure at a location in the first vapor outlet located between the first ampoule and the first sonic flow restrictor;
   a first dilution gas inlet that is in fluidic communication with the first vapor outlet;
   a first carrier gas flow controller configured to control the amount of carrier gas that flows through the first carrier gas inlet;
   a first dilution gas flow controller configured to control the amount of dilution gas that flows through the first dilution gas inlet; and
   a controller, the controller including:
      one or more processors; and
      a memory, wherein:
         the first sonic flow restrictor is positioned downstream of the first carrier gas inlet and the first ampoule,
         the first dilution gas inlet is connected with the first vapor outlet in a location between the first ampoule and the first sonic flow restrictor,
         the one or more processors are communicatively connected with the memory, the first carrier gas flow controller, and the first dilution gas flow controller, and
         the memory stores computer-executable instructions for controlling the one or more processors to:
            cause the first carrier gas flow controller and the first dilution gas flow controller to maintain a constant combined flow rate,
            control the first carrier gas flow controller and the first dilution gas flow controller to increase a ratio of carrier gas that flows through the first carrier gas inlet to dilution gas that flows through the first dilution gas inlet, while keeping the total flow combined flow rate of the carrier gas and the dilution gas constant, when the pressure sensor indicates a pressure of the combined carrier gas flow, dilution gas flow, and any vaporized reactant from the first quantity of reactant is below a first threshold, and
            control the first carrier gas flow controller and the first dilution gas flow controller to decrease the ratio of carrier gas that flows through the first carrier gas inlet to dilution gas that flows through the first dilution gas inlet, while keeping the total flow combined flow rate of the carrier gas and the dilution gas constant, when the pressure sensor indicates a pressure of the combined carrier gas flow, dilution gas flow, and any vaporized reactant from the first quantity of reactant is above a second threshold.

2. The apparatus of claim 1, wherein the first quantity of reactant is in solid phase.

3. The apparatus of claim 1, wherein the first quantity of reactant is in liquid phase.

4. The apparatus of claim 1, wherein the first sonic flow restrictor is sized such that carrier gas and vapor that are flowed through the first sonic flow restrictor during normal operating conditions of the semiconductor processing tool experience choked flow.

5. The apparatus of claim 1, further comprising the first quantity of the reactant, wherein the first quantity of the reactant is located within the interior volume.

6. The apparatus of claim 5, wherein the reactant is a solid-phase reactant selected from the group consisting of tungsten pentachloride and tungsten hexachloride.

7. The apparatus of claim 1, wherein the first carrier gas flow controller is positioned upstream of the first ampoule on the first carrier gas inlet.

8. The apparatus of claim 7,
wherein the one or more processors are further communicatively coupled with the pressure sensor and the memory further stores instructions for controlling the one or more processors to receive pressure data from the pressure sensor and to adjust the flow of carrier gas to the first ampoule responsive to changes in the pressure data.

9. The apparatus of claim 8, wherein memory further stores instructions for controlling the one or more processors to:
obtain, during a first time period, pressure measurements from the pressure sensor associated with a particular flow of carrier gas from the carrier gas inlet, dilution gas from the dilution gas inlet, or carrier gas from the carrier gas inlet and dilution gas from the dilution gas inlet when the first ampoule does not contain any reactant or when whatever reactant is in the first ampoule is not evaporating,
obtain, during a second time period, pressure measurements from the pressure sensor associated with the same particular flow of carrier gas from the carrier gas inlet, dilution gas from the dilution gas inlet, or carrier gas from the carrier gas inlet and dilution gas from the dilution gas inlet when the first ampoule contains the first quantity of reactant, and
determine an amount of vaporized reactant flowing through the first sonic flow restrictor during the second time period based, at least in part, on the difference in the pressure measurements obtained during the first time period and the pressure measurements obtained during the second time period.

10. The apparatus of claim 9, further comprising a temperature control system for controlling the temperature in the first ampoule, wherein the memory further stores instructions for controlling the one or more processors to:
control the temperature control system to increase the temperature in the first ampoule when the difference in the pressure measurements drops below a first target amount, and
control the temperature control system to decrease the temperature in the first ampoule when the difference in the pressure measurements increases above a second target amount.

11. The apparatus of claim 1, further comprising a carrier gas source, wherein the carrier gas source is connected with the first carrier gas inlet and is configured to supply a carrier gas to the first ampoule.

12. The apparatus of claim 11, further comprising a dilution gas source, wherein the dilution gas source is connected with the first dilution gas inlet and is configured to supply a dilution gas through the first dilution gas inlet.

13. The apparatus of claim 12, wherein the dilution gas and the carrier gas are the same gas.

14. The apparatus of claim 13, wherein the dilution gas source and the carrier gas source are the same.

15. The apparatus of claim 11, further comprising a first vacuum outlet, the first vacuum outlet joining the first vapor outlet downstream of the first ampoule and upstream of the first sonic flow restrictor.

16. The apparatus of claim 1, further comprising:
a second ampoule configured to receive a second quantity of reactant within a second interior volume of the second ampoule;
a second carrier gas inlet that is in fluidic communication with the second interior volume;
a second vapor outlet that is also in fluidic communication with the second interior volume;
a second sonic flow restrictor; and
a second dilution gas inlet that is in fluidic communication with the second vapor outlet, wherein:
the second sonic flow restrictor is positioned downstream of the second carrier gas inlet and the second ampoule, and
the second dilution gas inlet is connected with the second vapor outlet in a location between the second ampoule and the second sonic flow restrictor.

17. The apparatus of claim 16, wherein the first vapor outlet and the second vapor outlet join into a common vapor outlet downstream of the first sonic flow restrictor and the second sonic flow restrictor, respectively.

18. The apparatus of claim 16, wherein the first carrier gas inlet and the second carrier gas inlet diverge from a common carrier gas inlet upstream of the first ampoule and the second ampoule.

19. The apparatus of claim 16, wherein the first dilution gas inlet and the second dilution gas inlet diverge from a common dilution gas inlet upstream of the first vapor outlet and the second vapor outlet.

20. The apparatus of claim 19, further comprising a dilution gas mass flow controller located on the common dilution gas inlet.

21. The apparatus of claim 1, further comprising:
a vapor accumulator reservoir; and
a plurality of semiconductor processing stations, wherein:
each semiconductor processing station includes a microvolume,
the vapor accumulator reservoir has a vapor accumulation volume that is at least as large as the number of semiconductor processing stations times the microvolume volume,
the vapor accumulator reservoir is configured to supply vapor from the first vapor outlet to each semiconductor processing station,
the first vapor outlet empties into the vapor accumulator reservoir downstream of the first sonic flow restrictor, and
the vapor accumulator reservoir is downstream of the first sonic flow restrictor.

22. The apparatus of claim 21, wherein the first sonic flow restrictor is configured to isolate the first ampoule from pressure fluctuations at the semiconductor processing stations.

23. An apparatus for supplying vapor to a component of a semiconductor processing tool, the apparatus comprising:
a first ampoule configured to receive a first quantity of reactant within a first interior volume of the first ampoule;
a first carrier gas inlet that is in fluidic communication with the first interior volume;
a first vapor outlet that is also in fluidic communication with the first interior volume;
a first sonic flow restrictor;
a first dilution gas inlet that is in fluidic communication with the first vapor outlet;
a vapor accumulator reservoir; and
a plurality of semiconductor processing stations, wherein:
the first sonic flow restrictor is positioned downstream of the first carrier gas inlet and the first ampoule,
the first dilution gas inlet is connected with the first vapor outlet in a location between the first ampoule and the first sonic flow restrictor, each semiconductor processing station includes a microvolume, the vapor accumulator reservoir has a vapor accumulation volume that is at least as large as the number of semiconductor processing stations times the microvolume volume, the vapor accumulator reservoir is configured to supply vapor from the first vapor outlet to each semiconductor processing station, the first vapor outlet empties into the vapor accumulator reservoir downstream of the first sonic flow restrictor, and the vapor accumulator reservoir is downstream of the first sonic flow restrictor.

* * * * *

UNITED STATES PATENT AND TRADEMARK OFFICE
CERTIFICATE OF CORRECTION

PATENT NO. : 10,087,523 B2  
APPLICATION NO. : 15/595788  
DATED : October 2, 2018  
INVENTOR(S) : Joshua Collins et al.

Page 1 of 1

It is certified that error appears in the above-identified patent and that said Letters Patent is hereby corrected as shown below:

In the Claims

Line 45 Claim 1 Column 14, change "total flow combined flow rate" to --total combined flow rate--.

Line 56 Claim 1 Column 14, change "total flow combined flow rate" to --total combined flow rate--.

Signed and Sealed this  
Thirtieth Day of June, 2020

Andrei Iancu  
*Director of the United States Patent and Trademark Office*